United States Patent
Saitoh et al.

(10) Patent No.: US 6,919,253 B2
(45) Date of Patent: Jul. 19, 2005

(54) METHOD OF FORMING A SEMICONDUCTOR DEVICE INCLUDING SIMULTANEOUSLY FORMING A SINGLE CRYSTALLINE EPITAXIAL LAYER AND A POLYCRYSTALLINE OR AMORPHOUS LAYER

(75) Inventors: Tohru Saitoh, Ibaraki (JP); Katsuya Nozawa, Osaka (JP); Minoru Kubo, Nabari (JP); Shigetaka Aoki, Kashiwara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 82 days.

(21) Appl. No.: 10/359,553

(22) Filed: Feb. 7, 2003

(65) Prior Publication Data

US 2005/0066887 A1 Mar. 31, 2005

(51) Int. Cl.[7] .............................................. H01L 21/331
(52) U.S. Cl. ...................... 438/343; 438/350; 438/357; 438/365
(58) Field of Search ................................ 438/350, 357, 438/365, 343; 257/586

(56) References Cited

U.S. PATENT DOCUMENTS 6,100,152 A * 8/2000 Emons et al. ............... 438/350
6,384,469 B1   5/2002 Chantre ...................... 257/565
6,699,741 B1 * 3/2004 Sadovnikov et al. ........ 438/197
2002/0104476 A1 * 8/2002 Ferguson et al. ............. 117/84

FOREIGN PATENT DOCUMENTS

JP          09-186319       7/1997     ........... H01L/29/76

* cited by examiner

*Primary Examiner*—Olik Chaudhuri
*Assistant Examiner*—William M. Brewster
(74) *Attorney, Agent, or Firm*—McDermott Will & Emery LLP

(57) ABSTRACT

A method of fabricating a semiconductor device according to the present invention includes a step A of forming a polycrystalline or amorphous preliminary semiconductor layer on a surface of a substrate so as to have an opening portion and a step B of simultaneously forming an epitaxial growth layer on an exposed portion of a surface of the substrate through the opening portion and a non-epitaxial growth layer on the preliminary semiconductor layer using a CVD method while heating the substrate inside a reaction chamber by means of a heat source inside the reaction chamber, the epitaxial growth layer being made of single crystalline semiconductor, and the non-epitaxial growth layer being comprised of a polycrystalline or amorphous semiconductor layer.

8 Claims, 10 Drawing Sheets

METHOD OF FORMING A SEMICONDUCTOR DEVICE INCLUDING SIMULTANEOUSLY FORMING A SINGLE CRYSTALLINE EPITAXIAL LAYER AND A POLYCRYSTALLINE OR AMORPHOUS LAYER

BACKGROUND OF THE INVENTION

1. Field of the Invention

The present invention relates to a semiconductor device and a method of fabricating the semiconductor device, and more specifically to a hetero-bipolar transistor and a method of fabricating the hetero-bipolar transistor.

2. Description of the Related Art

In these years, in order to improve the performance of Si devices, an epitaxial growth technology using in-situ doping has been adopted, in which a dopant source material is supplied onto an Si substrate together with an Si source material. With this technology, the thickness and dopant profile in the formed film can be controlled by in-situ doping in epitaxial growth with a high degree of accuracy during an epitaxial growth, and, therefore, it is possible to obtain high performance devices as compared to an ion implantation process technology. Improvement of the performance has also been realized by using quantum effects by epitaxially growing a material having a different band gap, such as SiGe or SiGeC, onto an Si substrate.

Among epitaxial growth methods capable of providing such high performance devices, a chemical vapor deposition (CVD) method has widely been used, in which a source material is supplied in vapor phase and growth is carried out by using a chemical reaction on a substrate surface or in a vapor phase.

Generally, in the case where an epitaxial growth method is used in a process of forming integrated circuits, crystal growth is required on a substrate in which an isolation region and the like have already been formed.

Figure 9A:
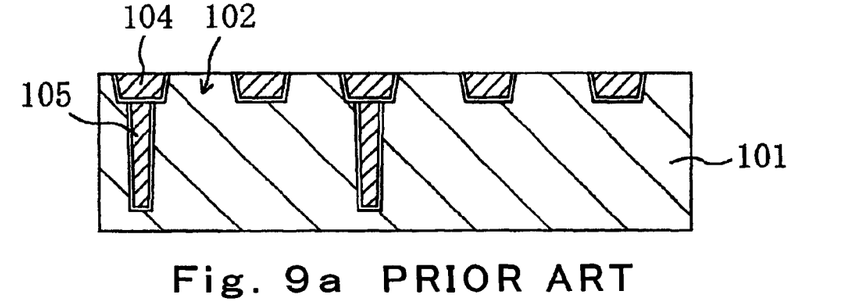
FIG. 9a is a sectional view showing steps of patterning a substrate.
Figure 9B:
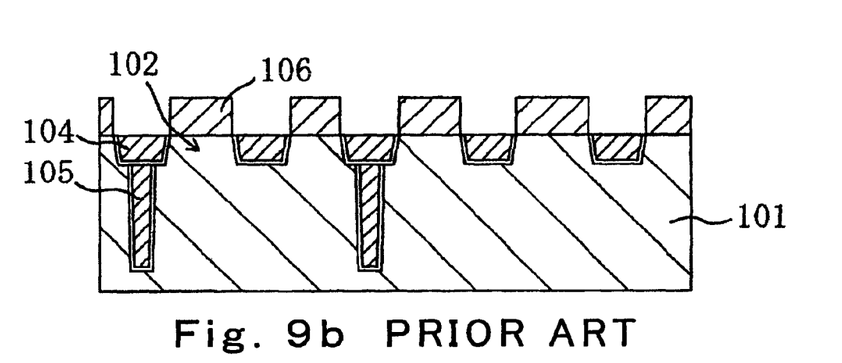
FIG. 9b is a sectional view showing a step of selectively growing an epitaxial crystalline layer on the substrate.
Figure 9C:
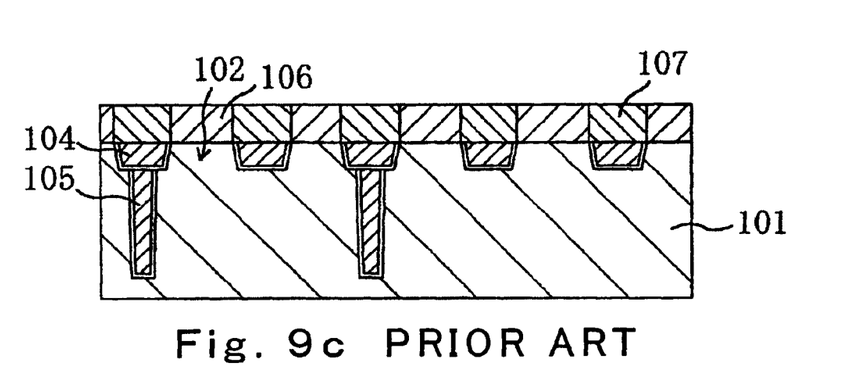
FIG. 9c is a sectional view showing a step of non-selectively growing an epitaxial crystalline layer on the substrate.

Hereinbelow, conventional epitaxial growth steps on a patterned substrate will be described with reference to FIGS. 9a–9c. FIGS. 9a–9c are sectional views showing steps of growing an epitaxial crystal layer on a substrate according to a conventional fabrication method.

First, in a step shown in FIG. 9a, a shallow trench isolation 104 where a silicon oxide ($SiO_2$) film is buried and a deep trench isolation 105 where undoped polysilicon is buried are formed on a substrate 101 having an active region made of Si crystal, with the active region 102 surrounded by the shallow trench isolation and the deep trench isolation. In this structure, a surface of the substrate 101 consists of an Si surface where the active region 102 is exposed and an $SiO_2$ surface where the shallow trench device 104 made of $SiO_2$ is exposed.

There are generally two kinds of epitaxial growth methods to be performed on a patterned substrate 101 shown in FIG. 9a, which are a selective growth method and a non-selective growth method. Hereinbelow, these two methods will be described with reference to FIGS. 9b and 9c.

First, the selective growth method will be described. FIG. 9b is a sectional view showing a step of forming an epitaxial layer 106 on the substrate 101 shown in FIG. 9a by a selective growth method. The selective growth method is a method for forming a film only on the active region 102 but not forming the film on the shallow trench isolation 104 in the substrate 101.

Although it has been reported that an epitaxial layer 106 can be selectively formed by optimizing the kind of material gas and crystal growth conditions, such a selective crystal growth is practically difficult since conditions capable of forming the epitaxial layer 106 are difficult to establish and maintain. Therefore, the method for selectively growing an epitaxial growth layer is not suitable for mass production.

Next, the non-selective growth method will be described. FIG. 9c is a sectional view showing a step of forming an epitaxial layer 106 and a polycrystalline layer 107 on the substrate 101 shown in FIG. 9a by a non-selective growth method. The non-selective growth method is a method for simultaneously forming an epitaxial layer 106 on the active region 102 and a polycrystalline layer 107 on the shallow trench isolation 104 in the substrate 101. With the non-selective growth method, the epitaxial layer 106 can be formed relatively easily, and therefore the non-selective growth method is suitable for mass production.

However, in the conventional non-selective growth method, there has arisen a problem that the control of layer thickness of an Si epitaxial layer is technically difficult. It is considered that layer thickness variation of this Si epitaxial layer is due to temperature variations at its growth surface during the layer formation, which will be described below.

Ways to heat a substrate in a CVD method include a cold wall type and a hot wall type.

Figure 10A:
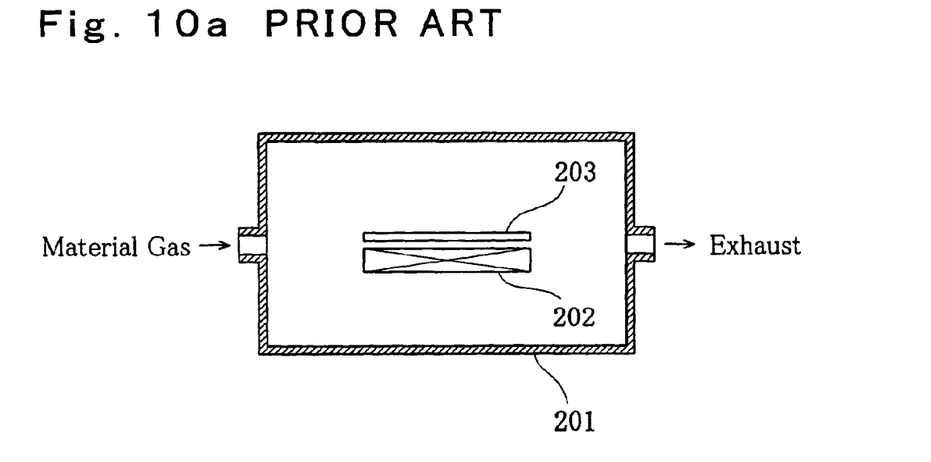
FIG. 10a is a view schematically showing a cold wall type.
Figure 10B:
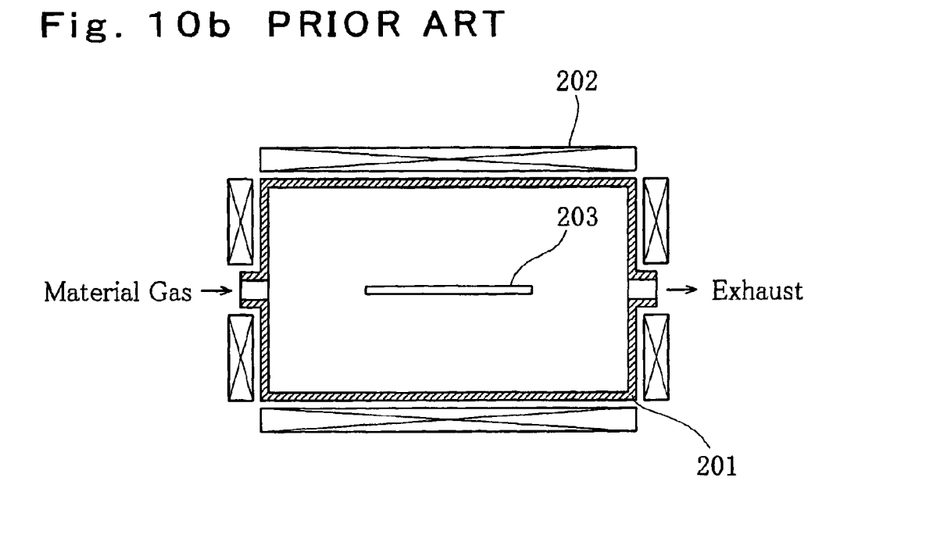
FIG. 10b is a view schematically showing a hot wall type.

FIGS. 10a and 10b are views showing ways to heat a substrate in a CVD method, in which FIG. 10a is a view schematically showing a cold wall type, and FIG. 10b is a view schematically showing a hot wall type.

As shown in FIG. 10b, in the hot wall type, a peripheral wall of a reaction chamber 201 is heated by means of a heater 202 or the like, and then a substrate (wafer) 203 placed within the reaction chamber 201 is heated by radiation heat from the peripheral wall. However, in this method, since the peripheral wall of the reaction chamber 201 is heated to a high temperature, a film is also formed on this peripheral wall and comes off when deposited to a certain extent, thereby causing the formation of particles. For this reason, in fabricating high-performance devices, the cold wall type is generally used.

As shown in FIG. 10a, in the cold wall type, the substrate 203 placed within the reaction chamber 201 is heated by means of a heat source 202 that is present within the reaction chamber 201. Therefore, the peripheral wall of the reaction chamber 201 is not heated to a high temperature, thereby preventing a film from being deposited on and from coming off the peripheral wall. It should be noted that, in the method shown in FIG. 10a, the heater 202 is provided as the heat source within the reaction chamber 201, and the substrate 203 is heated by means of this heater. In addition to this method, there are a method in which the substrate 203 within the reaction chamber 201 is heated by electromagnetic induction using a high frequency coil provided around the reaction chamber 201 and a method in which the substrate 203 within the reaction chamber 201 is irradiated with and heated by infrared ray coming from the outside through a window provided in the peripheral wall of the reaction chamber 201. In these cases, the substrate 203 receives energy from the outside of the reaction chamber 201 in the form other than heat and generates. That is, the substrate 203 serves as a heat source.

By the way, when an epitaxial growth is performed on an Si substrate by a CVD method using this cold wall type, the epitaxial growth is performed while the substrate is heated by means of a heat source within a reaction chamber. During the epitaxial growth, the temperature of a growth surface of the substrate is determined as a temperature at which an equilibrium between the amounts of heat supplied from the heat source and emitted from the substrate is maintained. It has been found out that the amount of heat emitted from the substrate depends largely on the material of the substrate surface and the constitution of the substrate, and problems as will be described below have arisen at a surface of the conventional substrate.

Specifically, in the non-selective growth step shown in FIG. 9c, a crystal growth is performed on the active region 102 in the surface of the substrate 101 and on the shallow trench isolation 104. When the substrate 101 is uniformly heated from the outside during this crystal growth, the actual surface temperature of the growth surface of the substrate 101 becomes non-uniform because Si crystal which forms the active region 102 and silicon oxide buried in the shallow trench isolation region 104 have different heat emissivities each other. This non-uniform distribution of the actual surface temperature in the growth surface has made it difficult to achieve eveness of the Si epitaxial layer 106.

The Si epitaxial layer 106 and the polycrystalline polysilicon layer 107 are formed respectively on the active region 102 and the shallow trench isolation 104. A constant amount of heat is given to the polycrystalline polysilicon layer 107 from the heat source through the substrate 101 during the growth of the Si epitaxial layer 106. On the other hand, the heat emitting conditions at a growth surface of the polycrystalline polysilicon layer 107 change as a growing film thickness of the polycrystalline polysilicon layer 107 changes. That is, while the amount of heat absorbed by the polycrystalline polysilicon layer 107 is constant, the amount of heat emitted from the polycrystalline polysilicon layer 107 changes. As a result, the temperature of the growth surface of the polycrystalline polysilicon layer 107 changes.

It is extremely difficult to measure with a high degree of accuracy the surface temperature of the growth surface of the polycrystalline polysilicon layer 107 while the growth proceeds. Accordingly, it is also difficult to change the amount of heat to be supplied from the heat source according to the surface temperature change during the growth of the polycrystalline polysilicon layer 107. Consequently, it has been considered that a surface temperature change of the growth surface is difficult to suppress.

For the reason stated above, there has arisen a problem that the layer thickness of an Si epitaxial layer is difficult to control in the non-selective growth.

This problem arises because the temperature of the growth surface of the substrate changes as the amount of heat emitted from the growth surface changes. Therefore, such a problem does not arise in the hot wall type where the temperature of a growth surface of the substrate is kept constant by emitting heat from a peripheral wall of the reaction chamber. That is, this problem is inherent to the cold wall type.

SUMMARY OF THE INVENTION

An object of the present invention is to provide a semiconductor device in which the layer thickness of an epitaxial growth layer is easily controlled in a non-selective growth method of a cold wall type and its fabrication method.

The present inventors found out from a study conducted to achieve the above-mentioned object that, in a non-selective growth of a cold wall type, a temperature change due to heat emission from a growth surface of an epitaxial growth layer formed on a region of a surface of a substrate where an epitaxial growth is performed could be suppressed by preliminarily forming a polycrystalline or amorphous semiconductor layer on a region of the surface of the substrate where the epitaxial growth is not performed.

Therefore, a method of fabricating a semiconductor device according to the present invention comprises: a step A of forming a polycrystalline or amorphous preliminary semiconductor layer on a surface of a substrate so as to have an opening portion; and a step B of simultaneously forming an epitaxial growth layer on an exposed portion of a surface of the substrate through the opening portion and a non-epitaxial growth layer on the preliminary semiconductor layer using a CVD method, while heating the substrate inside a reaction chamber by means of a heat source inside the reaction chamber, the epitaxial growth layer being made of single crystalline semiconductor, and the non-epitaxial growth layer being comprised of a polycrystalline or amorphous semiconductor layer. In this constitution, a change in the amount of heat emission from the growth surface of the non-epitaxial growth layer accompanied with the growth thereof becomes small according to the thickness of the preliminary semiconductor layer preliminarily formed on a region of the surface of the substrate where the epitaxial growth is not performed, thereby suppressing a temperature change at the growth surface. Consequently, the layer thickness of an epitaxial growth layer can be easily controlled.

The preliminary semiconductor layer preferably has a layer thickness of not less than 50 nm. In this constitution, even when the layer thickness of the preliminary semiconductor layer changes at or above a layer thickness of 50 nm, the thickness of an epitaxial growth layer to be formed does not change largely, thereby easily achieving an epitaxial growth layer having a desired layer thickness.

The preliminary semiconductor layer preferably has a layer thickness of not more than 300 nm.

The preliminary semiconductor layer preferably has a layer thickness of not more than 150 nm.

An opening ratio defined as a ratio of an area of the opening portion to a surface area of the substrate is preferably not less than 0.1% and not more than 20%.

The preliminary semiconductor layer may mainly be made of at least one of Si polycrystal, SiGe polycrystal, and SiGeC polycrystal.

The epitaxial growth layer may mainly be made of at least one of Si single crystal, SiGe single crystal, and SiGeC single crystal.

The semiconductor device may be a bipolar transistor, and the substrate may have an active region which is made of single crystal semiconductor and an isolation region. The preliminary semiconductor layer may be formed on at least a portion of a surface of the active region so as to have a base opening portion. In the step B, using the CVD method, while the substrate is heated within the reaction chamber by means of the heat source within the reaction chamber, the epitaxial growth layer forming at least a portion of the intrinsic base may be formed in an exposed portion of a surface of the active region through the base opening portion, and, simultaneously, the non-epitaxial growth layer forming at least another portion of the extrinsic base may be formed on the preliminary semiconductor layer.

The preliminary semiconductor layer may form at least a portion of the extrinsic base.

The heat source may be a heater disposed within the reaction chamber.

The heat source may generate heat with energy supplied in the form other than heat from the outside of the reaction chamber.

A semiconductor device according to the present invention comprises a substrate; a polycrystalline or amorphous preliminary semiconductor layer formed on a surface of the substrate, the preliminary semiconductor layer having an opening portion and a layer thickness of not less than 50 nm and not more than 300 nm; an epitaxial growth layer made of single crystalline semiconductor formed on a portion of the surface of the substrate exposed through the opening portion; and a non-epitaxial growth layer comprised of a polycrystalline or amorphous semiconductor layer formed on the preliminary semiconductor layer.

The semiconductor device is a bipolar transistor; the substrate includes an active region that is made of single crystalline semiconductor and an isolation region; the preliminary semiconductor layer has a base opening portion on at least a portion of a surface of the active region; and the non-epitaxial growth layer may form at least another portion of an extrinsic base.

The preliminary semiconductor layer may form at least a portion of the extrinsic base.

The preliminary semiconductor layer preferably has a layer thickness of not less than 50 nm and not more than 150 nm.

The object, as well as other objects, features and advantages of the present invention will become more apparent to those skilled in the art from the following detailed description of the preferred embodiments taken with reference to the accompanying drawings.

BRIEF DESCRIPTION OF THE DRAWINGS

FIGS. 9a–9c are views showing a conventional epitaxial growth method, in which FIGS. 10a and 10b are views showing a method for heating the substrate, in which

DETAILED DESCRIPTION OF THE PREFERRED EMBODIMENTS

Hereinbelow, preferred embodiments of the present invention will be described with reference to the drawings.
(First Embodiment)

FIGS. 1a–1d are sectional views showing a method of fabricating a semiconductor device according to a first embodiment of the present invention.

The present embodiment exemplifies a case where an SiGe epitaxial growth layer is made to grow on an Si substrate as a method of fabricating a semiconductor device. In the present embodiment, CVD was performed using a cold wall type shown in FIG. 10a. The opening area ratio of an active region 2 (a ratio of a total area of the active region 2 to a surface area of a substrate 1; this is substantially equal to the opening area ratio in a polysilicon layer 9a in the present embodiment) is on the order of 10%. Therefore, in FIGS. 1a–1d, an active region 2 is more exaggerated than a shallow trench isolation 4.

Figure 1A:
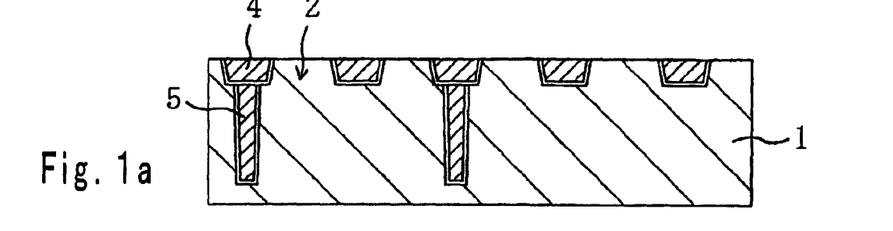
FIGS. 1a–1d are sectional views showing a method of fabricating a semiconductor device according to a first embodiment of the present invention.

First, in a step shown in FIG. 1a, in the substrate 1 having the active region 2 made of Si crystal, the shallow trench isolation 4 where silicon oxide film is buried and a deep trench isolation 5 where undoped polysilicon is buried are formed, with the active region 2 surrounded by the shallow trench isolation 4.

Figure 1B:
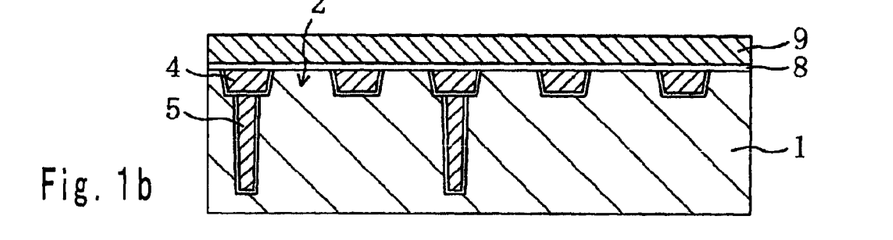

In a step shown in FIG. 1b, an insulating film 8 made of silicon oxide with a thickness of 40 nm is formed on the substrate 1, and then a polysilicon film 9 is formed on the insulating film 8. This polysilicon film 9 preferably has a film thickness of not less than 50 nm and not more than 300 nm. The reason for this will be described later. Here, a film thickness value of slightly more than 50 nm is chosen.

Figure 1C:
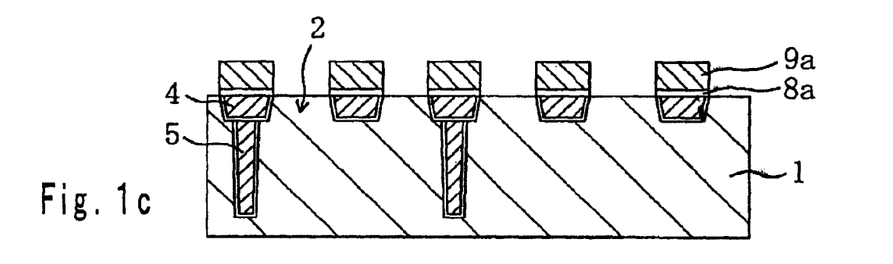

In a step shown in FIG. 1c, portions of the insulating film 8 and polysilicon film 9 that are located above a region including the active region 2 of the substrate 1 are removed by photolithography and etching. Thereby, at least a portion of an upper surface of the shallow trench isolation 4 of the substrate 1 is covered with the insulating film 8a and the polysilicon layer (a preparative semiconductor layer) 9a, and an upper surface of the active region 2 of the substrate 1 is exposed. At this time, a region ranging substantially from the upper surface of the active region 2 to a portion of the upper surface of the shallow trench isolation 4 may be exposed in view of misalignment in the photolithography process. It should be noted that the polysilicon film 9 is removed by dry-etching, and the insulating film 8 is removed by wet-etching using buffered HF. Thereafter, the surface of the substrate is subjected to HF treatment for washing, and the exposed surface of the active region of the substrate 1 is subjected to hydrogen termination treatment. In these process steps, at least a portion of the insulating film 8 is covered with the polysilicon film 9 for protection.

Figure 1D:
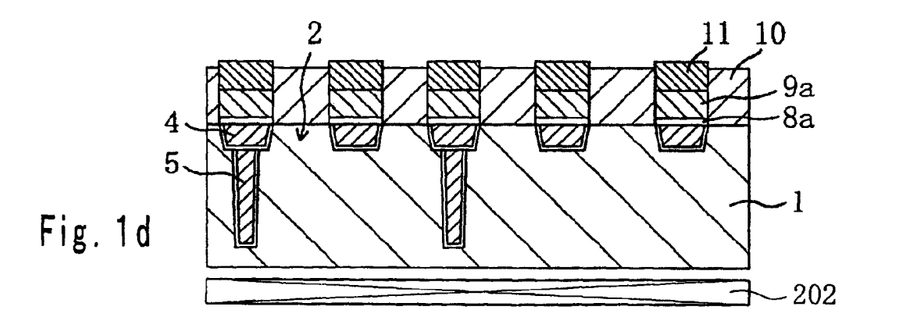

In a step shown in FIG. 1d, the substrate is introduced into a load lock chamber where an internal pressure of $1\times10^{-4}$ Pa is maintained, and then the pressure is reduced until an ultra-high vacuum environment of $5\times10^{-7}$ Pa or less is achieved in a growth chamber (reaction chamber). Thereafter, the growth chamber is maintained at 750° C. for 5 min using a heater 202 provided inside the growth chamber. After stabilizing the temperature of the substrate at 600°

C., an $Si_2H_6$ gas and a $GeH_4$ gas are supplied onto the substrate for a predetermined period of time using a CVD method. By doing this, an SiGe epitaxial growth layer 10 having a thickness of approximately 90 nm was formed on the active region 2 exposed in the substrate 1, and a poly-SiGe layer (a non-epitaxial growth layer) 11 was formed on the polysilicon layer 9a. The thickness of approximately 90 nm of this SiGe epitaxial growth layer 10 was substantially equal to a desired thickness. It should be noted that the temperature of the heater 202 was monitored and its heater current was controlled so as to keep the heater 202 at a constant temperature during the growth of the SiGe epitaxial growth layer 10. It should also be noted that other gases including Si and Ge may be employed as material gases for Si and Ge used in the CVD method.

Next, a principle of a method of fabricating the semiconductor device according to the present embodiment will be described.

Figure 2:
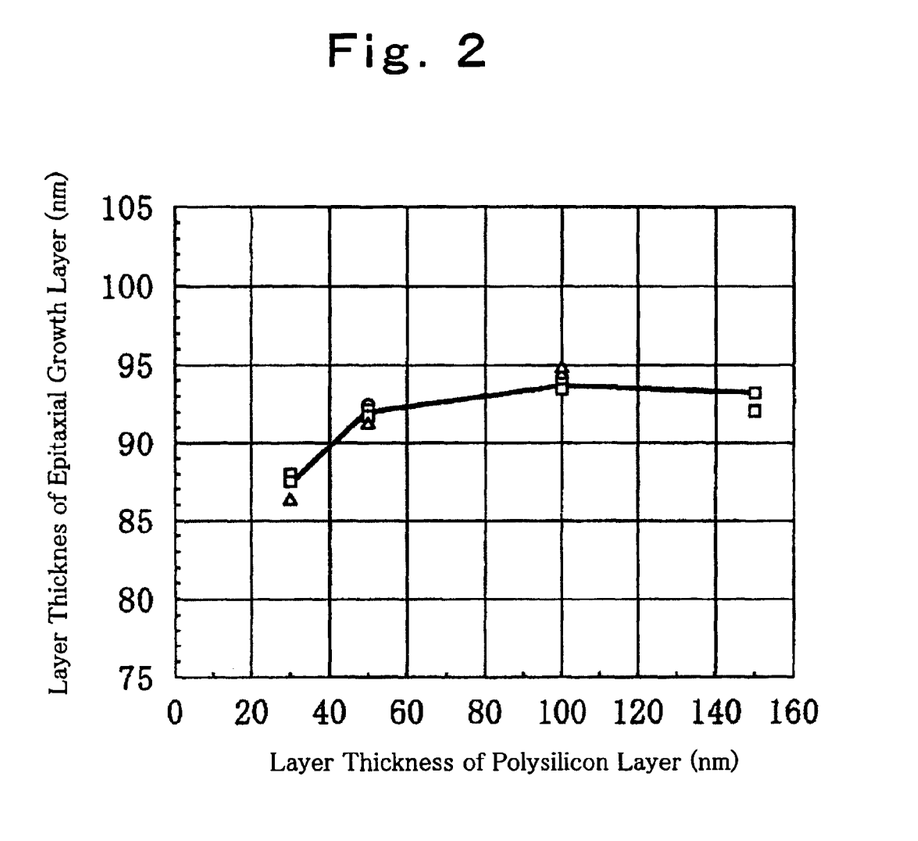
FIG. 2 is a graph showing the layer thickness of a polysilicon layer in a step shown in FIG. 1c along an axis of abscissa and the layer thickness of an epitaxial growth layer in a step shown in FIG. 1d along an axis of ordinate.

FIG. 2 is a graph showing the layer thickness of the polysilicon layer 9a in the step shown in FIG. 1c along the axis of abscissa and the layer thickness of the epitaxial growth layer in the step shown in FIG. 1d along the axis of ordinate. The data was obtained by performing the fabrication steps shown in FIGS. 1a–1d with the thickness of the polysilicon layer 9a being 30, 50, 100, and 150 nm. The SiGe epitaxial layer 10 was made to grow under the same predetermined conditions as described above (time, amount of heat supplied, etc.). The layer thickness of the obtained SiGe epitaxial layer 10 was measured using an optical ellipsometer.

Referring to FIG. 2, with the layer thickness of the polysilicon layer 9a being approximately 50 nm or more, the layer thickness of the SiGe epitaxial layer 10 has substantially a constant value even if the layer thickness of the polysilicon layer 9a changes.

In contrast, with the layer thickness of the polysilicon layer 9a being less than 50 nm, the layer thickness of the SiGe epitaxial layer 10 decreases as decreasing layer thickness of the polysilicon layer 9a. For example, it is shown with good repeatability that the layer thickness of the SiGe epitaxial layer 10 is approximately 5 nm thinner (approximately 7% of the total layer thickness of the SiGe epitaxial layer 10) when the layer thickness of the polysilicon layer 9a is 30 nm than when the layer thickness of the polysilicon layer 9a is 50 nm or more.

The reason will be described below why the film thickness of the SiGe epitaxial layer 10 changes when the layer thickness of the polysilicon layer 9a is less than approximately 50 nm.

The SiGe epitaxial layer 10 is formed at the same time that a poly-SiGe layer 11 is formed on the polysilicon layer 9a. During this forming period, when the layer thickness of the polysilicon layer 9a is thin, the ratio of a value of a change in layer thickness of the poly-SiGe layer 11 to the value of the layer thickness of the polysilicon layer 9a is large. Therefore, the ratio of a change in distance from the substrate 1 to the growth surface of the poly-SiGe layer 11 before and after the growth to the distance from the substrate to the growth surface of the poly-SiGe layer 11 is also large. For this reason, it can be considered that heat radiation from the surface of the poly-SiGe layer 11 largely changes as increasing film thickness of the poly-SiGe layer 11 during the growth, thereby also causing the temperature of the growth surface of the substrate 1 to change. It can also be considered that such a change in temperature of the growth surface of the substrate 1 will change the layer thickness of the resulting SiGe epitaxial layer 10.

On the other hand, the layer thickness of the SiGe epitaxial layer 10 has substantially a constant value when the layer thickness of the polysilicon layer 9a is approximately 50 nm or more. This is due to the fact that when the layer thickness is larger than a certain thickness, the heat radiation of the surface of the poly-SiGe layer 11 is less likely to change even if the layer thickness of the poly-SiGe layer changes, thereby reducing the change in temperature of the growth surface.

It follows from the preceding description that when non-selective growths are each performed under the same conditions on a substrate in which a polysilicon layer 9a having an approximately 50 nm or more layer thickness is pre-deposited on a region of a surface of the substrate where an epitaxial growth is not performed (shallow trench isolation; hereinbelow, referred to as a non-epitaxial growth region), the film thicknesses of the finally obtained SiGe epitaxial layers 10 have an approximately constant layer thickness (for example, not less than 90 nm and not more than 95 nm in FIG. 2) even when the layer thicknesses of the polysilicon layer 9a are different. In other words, a temperature change (hence, a change in growth rate) due to heat emission from the growth surface of the substrate can be substantially eliminated by preliminarily depositing the polysilicon layer 9a having a layer thickness of approximately 50 nm or more on the non-epitaxial growth region of the surface of the substrate and then performing the non-selective growth on the substrate. In this way, the layer thickness of the epitaxial growth layer is easily controlled. Especially when the epitaxial growth layer has a compositional profile in the thickness direction, such a profile can be easily controlled.

Although FIG. 2 does not show a case where the thickness of the polysilicon layer 9a is more than 150 nm, it is believed that there is theoretically no upper limit to the preferred thickness of the polysilicon layer 9a due to the fact that the layer thickness variation curve of the epitaxial growth layer relative to the thickness of the polysilicon layer tends to saturate and due to its reasons. However, since an increase in layer thickness of the polysilicon layer 9a leads to an increase in volume of a semiconductor device, the layer thickness of the polysilicon layer 9a is preferably not more than 300 nm. Furthermore, even when the layer thickness of the polysilicon layer 9a is less than approximately 50 nm, heat emission from the growth surface of the substrate is more suppressed than when the polysilicon layer 9a is not provided. Therefore, control of the layer thickness of the SiGe epitaxial growth layer 10 becomes easier correspondingly. For the reasons described above, the layer thickness of the polysilicon layer 9a is preferably not less than 50 nm and not more than 300 nm, and more preferably not less than 50 nm and not more than 150 nm.

Furthermore, as apparent from the preceding description, the present invention becomes more effective as heat emission from a growth surface of a polycrystalline or an amorphous layer (poly-SiGe layer 11) in a non-epitaxial growth region becomes dominant in heat emission from a growth surface of all the substrate. Accordingly, it is preferable that the open area ratio (the open area ratio of the polysilicon layer 9a) of the epitaxial growth region (the active region 2) is smaller. Specifically, the open area ratio of the epitaxial growth region is preferably not less than 0.1% and not more than 20%. As described previously, the open area ratio of the epitaxial growth region, when the data of FIG. 2 was obtained, is on the order of 10%.

In a known publication (D.L. Harame et. al., IEEE Transactions on Electron Devices, vol. 42 (1995) p469–482), a non-selective growth method is disclosed in which an insulator and a polycrystalline silicon layer called "protect layer" are preliminarily formed in a non-epitaxial growth region of a substrate (an oxide film forming region), and then a non-selective growth is performed on that substrate. However, since this non-selective growth method employs a hot wall type, and the "protect layer" is aimed at preventing gas from being released from the oxide film, this non-selective growth method is completely different from that of the present invention.

While, in the present embodiment, the insulating film 8 and the polysilicon film 9 are deposited on the substrate, and then portions of the insulator and the polysilicon film on the active region 2 are removed by etching, the insulating film 8a and the polysilicon 9a may be formed using any other well known method.

While, in the CVD method used in the above-described fabrication method, an example of an epitaxial growth using an ultra-high vacuum vapor deposition is shown, any other epitaxial growth method such as a low pressure vapor phase deposition method may be employed in the present embodiment.

Furthermore, in place of the SiGe epitaxial layer 10 of the present embodiment, a layer containing any other semiconductor material such as homo Si epitaxial growth layer or SiGeC growth layer may be formed. Similarly, in place of the poly-SiGe layer 11, a poly-Si layer or a poly-SiGeC layer may be formed.

(Second Embodiment)

In a second embodiment of the present invention, an example will be described in which the semiconductor device and the fabrication method thereof according to the first embodiment are applied to a bipolar transistor and a fabrication method thereof. More specifically, a bipolar transistor including an epitaxial growth layer and a polysilicon layer situated around and having a thickness of not less than approximately 50 nm and a fabrication method thereof will be described.

First of all, referring to FIG. 7b, a structure of the bipolar transistor according to the present embodiment will be described. FIG. 7b is a sectional view showing a structure of the bipolar transistor according to the present embodiment. An upper portion of an Si substrate 21 has a retrograde well 22 containing an n-type impurity such as P. And, the Si substrate 21 is provided with a collector layer 23, a shallow trench isolation 24 and a deep trench isolation 25 which serve as isolations surrounding the collector layer 23, and an n$^+$ collector plug layer 26.

A first deposited oxide film 28 having a base opening portion 27 is provided on the Si substrate, and a polysilicon layer 29 having a thickness from 50 nm to 300 nm is formed on the first deposited oxide film. An SiGe epitaxial layer 30 obtained by an epitaxial growth method is formed in a portion of the Si substrate exposed to the base opening portion 27. A bottom portion of a center portion (a region located below an emitter opening portion 34 to be described later) of the SiGe epitaxial layer 30 functions as an intrinsic base 31 containing a p-type impurity such as B. Furthermore, an upper portion of the center portion of the the SiGe epitaxial layer 30 functions as an emitter layer 32 containing an n-type impurity such as P.

A poly-SiGe layer 33 is formed on the polysilicon layer 29. And, a second deposited oxide film 35 having the emitter opening portion 34 is formed so as to extend from an upper surface of the SiGe epitaxial layer 30 to cover a surface of a portion of the poly-SiGe layer 33. A p$^+$ polysilicon layer 36 is formed on the poly-SiGe layer 33 and the second deposited oxide film 35, and a third deposited oxide film 37 is formed on a portion of the p$^+$ polysilicon layer 36. Here, the polysilicon layer 29, the poly-SiGe layer 33, and the p$^+$ polysilicon layer 36 function as an extrinsic base 38. It should be noted that a side wall 39 made of silicon oxide is formed in inner faces of the third deposited oxide film 37 and the p$^+$ polysilicon layer 36 that are facing the emitter opening portion 34, and the side wall 39 is in contact with an upper face of the second deposited oxide film 35.

An n$^+$ polysilicon layer 40 is formed to fill the emitter opening portion 34 and to extend on a third deposited oxide layer 37 and functions as an emitter electrode. A sidewall 41 covers outer surfaces of the n$^+$ polysilicon layer 40 and the extrinsic base 38. Ti silicide layers 42 are formed respectively on surfaces of the n$^+$ collector plug layer 26, the p$^+$ polysilicon layer 36, and the n$^+$ polysilicon layer 40.

On the substrate, an interlayer dielectric 43 is provided to cover the bipolar transistor. And, contact holes reaching, through the interlayer dielectric 43, the Ti silicide layers 42 on the n$^+$ type collector plug layer 26, the p$^+$ polysilicon layer 36, and the n$^+$ polysilicon layer 40 serving as an emitter electrode and W plugs 44 filling the contact holes are formed. And, metallic wiring 45 is connected to each of the W plugs 44 and extends on the interlayer dielectric 43.

Next, a method of fabricating the bipolar transistor according to the present embodiment will be described with reference to FIGS. 3a, 3b to FIGS. 7a, 7b. It should be noted that a collector layer 23 is more exaggerated than a shallow trench isolation 24 in FIGS. 3a, 3b to 7a, 7b.

Figure 3A:
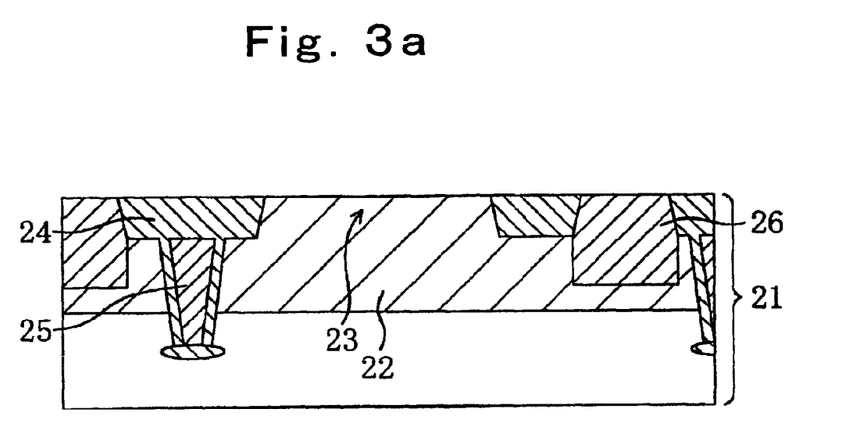
FIGS. 3a and 3b are sectional views showing steps of forming a polysilicon layer and the like in a method of fabricating a bipolar transistor according to a second embodiment of the present invention.

First of all, in a step shown in FIG. 3a, a retrograde well 22 containing P serving as an n-type impurity is formed on an upper portion of the Si substrate 21. At this time, the concentration of the n-type impurity is set to be on the order of $1 \times 10^{17}$ atms. cm$^{-3}$ because a region near a surface of the Si substrate 21 function as the collector layer 23.

Then, as isolations, a shallow trench isolation 24 having a depth of 0.35 $\mu$m and a deep trench isolation 25 having a depth of 2 $\mu$m, both of which are made of silicon oxide, are formed. A region located between shallow trench isolations 24 becomes a collector layer (active area) 23. Also, an n$^+$ collector plug layer 26 for making contact with the collector 23 is formed in a region separated from the collector 23 by the shallow trench isolation 24.

Figure 3B:
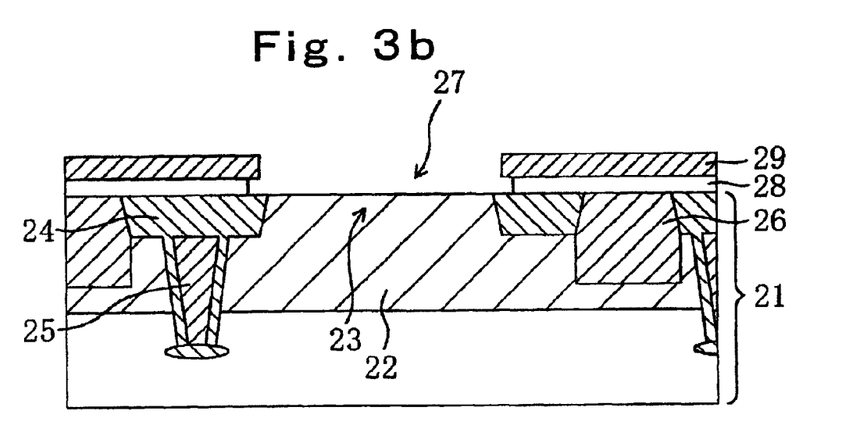

In a step shown in FIG. 3b, a first deposited oxide film 28 made of silicon oxide and having a thickness of 40 nm is formed on the substrate 1, and then a polysilicon film 29 is formed on the first deposited oxide film 28. The film thickness of the polysilicon film 29 is preferably not less than 50 nm and not more than 300 nm.

Thereafter, portions of the first deposited oxide film 28 and the polysilicon film 29 above the collector 23 of the substrate 21 are removed by photolithography and etching to form a base opening portion 27. Thereby, the first deposited oxide film 28 and the polysilicon film (preliminary semiconductor layer) 29 cover an upper surface of the shallow trench isolation 24 in the substrate 21, and an upper surface of the n-type collector 23 in the substrate 21 is exposed. Following this, the surface of the substrate is subjected to hydrofluoric acid treatment for washing, and the upper surface of the collector layer 23 exposed in the Si substrate 21 is subjected to hydrogen termination treatment. In these steps, a region of the first deposited oxide film 28 that is close to the base opening portion 27 is removed.

Figure 4A:
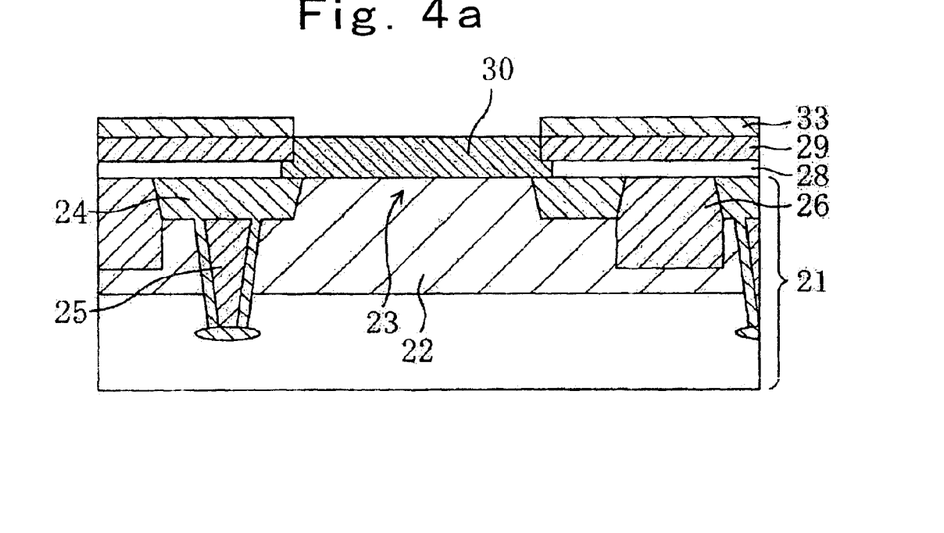
FIGS. 4a and 4b are sectional views showing steps of performing an epitaxial growth and the like in the method of fabricating the bipolar transistor according to the second embodiment of the present invention.

In a step shown in FIG. 4a, the substrate is introduced into a load lock chamber where an internal pressure thereof is maintained to be $1 \times 10^{-4}$ Pa or less. Furthermore, a growth chamber (reaction chamber) is evacuated to an ultra-vacuum of $5 \times 10^{-7}$ Pa, and, under this condition, the temperature of the growth chamber is maintained to be 750° C. for 5 min by means of a heater 202 disposed in the growth chamber. With this heating, the temperature of the substrate is stabilized at 600° C., and thereafter, $Si_2H_6$ gas, $GeH_4$ gas, and $B_2H_6$ gas are supplied onto the substrate by the CVD method. In this way, an SiGe epitaxial layer 30 having a thickness of approximately 90 nm and containing a p-type impurity B is formed on the collector layer 23 exposed to the base opening portion, and a poly-SiGe layer 33 is formed on the polysilicon layer 29. The SiGe epitaxial layer 30 may have a Ge concentration (composition) gradient.

In the above-described steps, during the growth of the SiGe epitaxial layer 30, the temperature of the heater 202 is monitored to control the heater current of the heater 202 so that the temperature of the heater 202 is kept constant. As material gases containing Si, Ge, and B for use in the CVD method, any other gases containing Si, Ge, and B may be used.

Figure 4B:
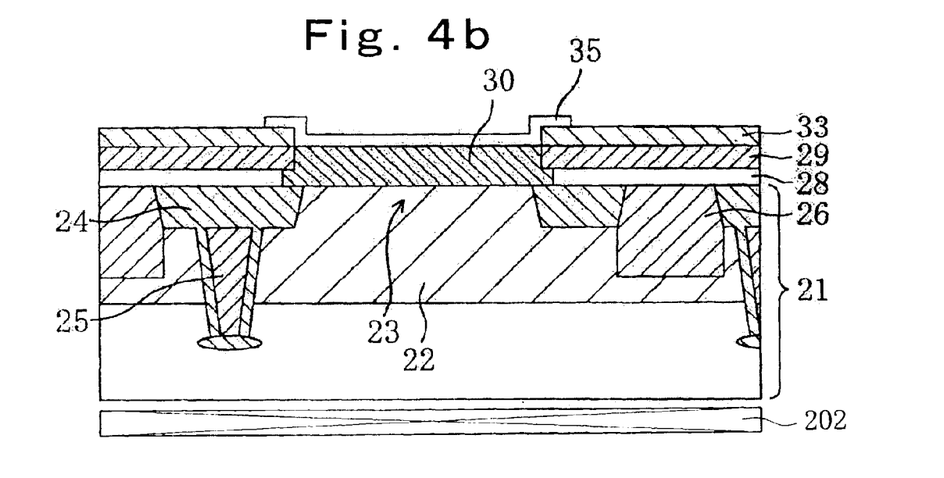

In a step shown in FIG. 4b, a film having a thickness of 50 nm and made of silicon oxide is formed and etched on the substrate, thereby forming a second deposited oxide film 35, which extends from an upper surface of the SiGe epitaxial layer 30 to a portion of the surface of the poly-SiGe layer 33.

Figure 5A:
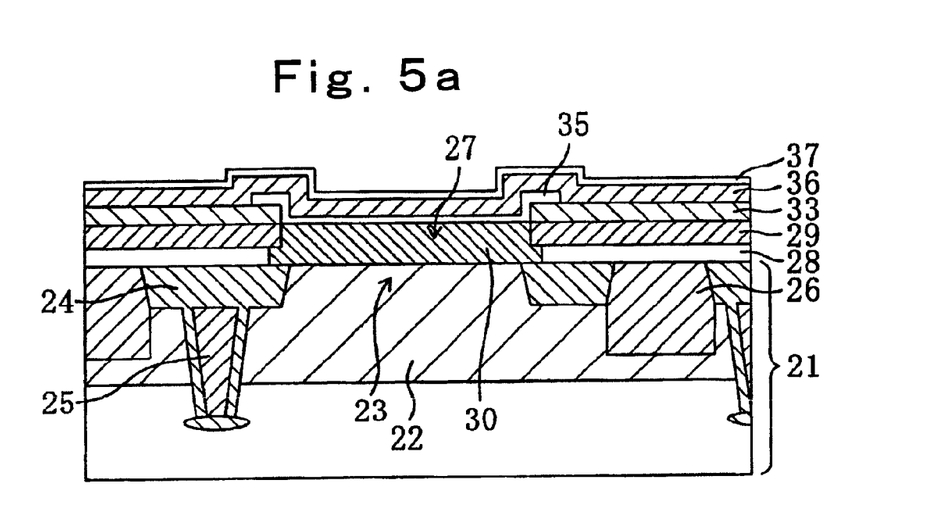
FIGS. 5a and 5b are sectional views showing steps of forming an emitter opening portion and the like in the method of fabricating the bipolar transistor according to the second embodiment of the present invention.

In a step shown in FIG. 5a, a p$^+$ polysilicon layer 36 having a thickness of 200 nm is formed on the substrate, and a third deposited oxide film 37 having a thickness of 150 nm is formed on the polysilicon layer.

Figure 5B:
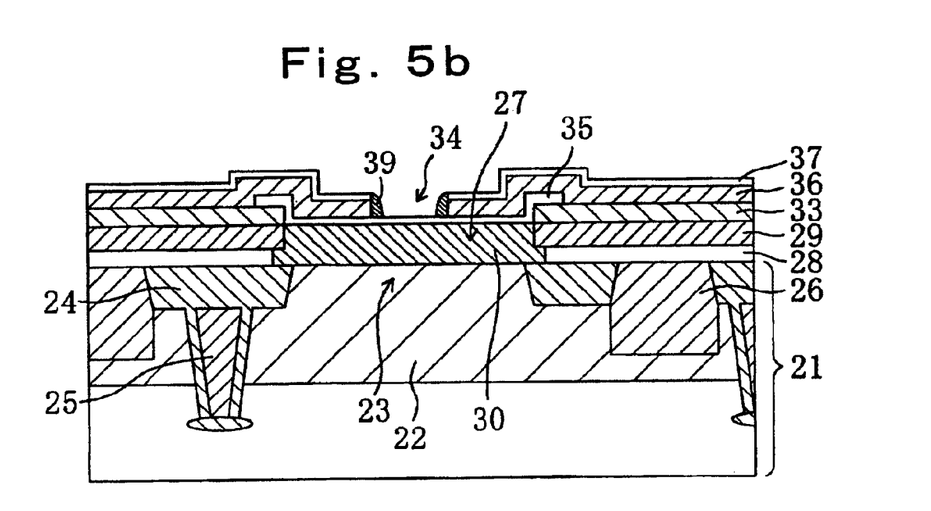

In a step shown in FIG. 5b, portions of the third deposited oxide film 37 and the p$^+$ polysilicon layer 36 located above a center portion of the SiGe epitaxial layer 30 are removed, thereby forming an emitter opening portion 34. A side wall 39 made of silicon oxide is formed on a side face of the third deposited oxide film 37 facing the emitter opening portion 34 and a side face of the p$^+$ polysilicon layer 36. The side wall 39 is in contact with the second deposited oxide film 35.

Figure 6A:
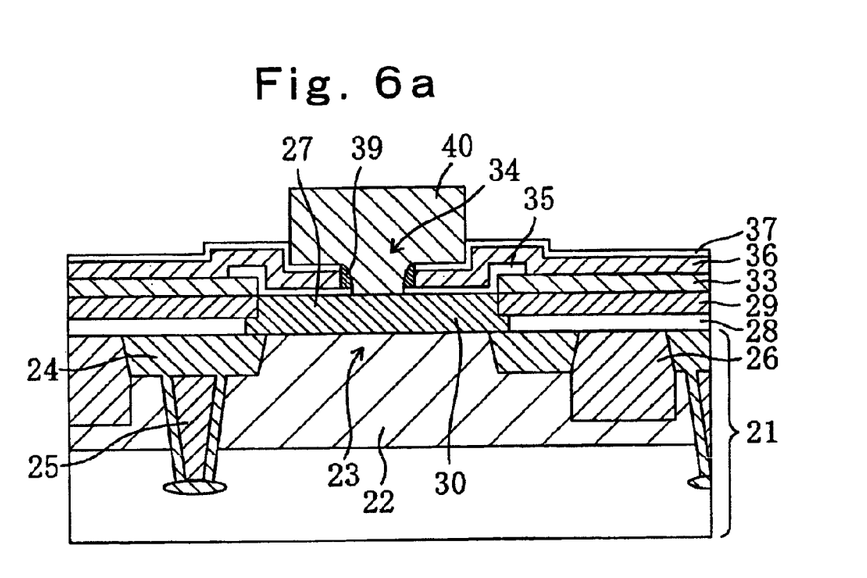
FIGS. 6a and 6b are sectional views showing steps of forming an emitter electrode and the like in the method of fabricating the bipolar transistor according to the second embodiment of the present invention.

In a step shown in FIG. 6a, the second deposited oxide film 35 is patterned using, as masks, the third deposited oxide film 37, the p$^+$ polysilicon layer 36, and the side wall 39, thereby exposing a portion of the upper surface of the SiGe epitaxial layer 30 to the emitter opening portion 34.

Then, an n$^+$ polysilicon layer is deposited on the substrate to fill the emitter opening portion 34, and a portion of the n$^+$ polysilicon layer other than the emitter opening portion 34 and an outer peripheral portion thereof are removed to thereby form an n$^+$ polysilicon layer 40. The n$^+$ polysilicon layer 40 functions as an emitter electrode.

Figure 6B:
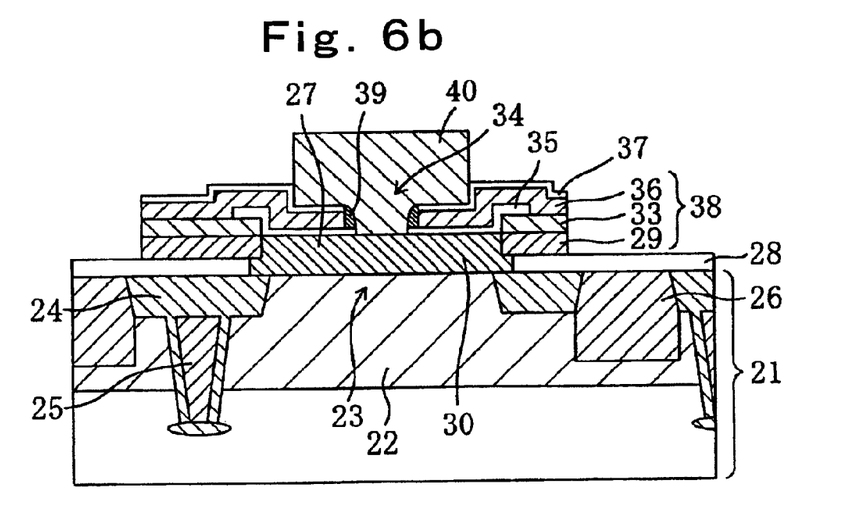

In a step shown in FIG. 6b, the third deposited oxide film 37, the p$^+$ polysilicon layer 36, the poly-SiGe layer 33, and the polysilicon layer 29 are patterned to define the shape of an extrinsic base 38 comprised of the p$^+$ polysilicon layer 36, the poly-SiGe layer 33, and the polysilicon layer 29.

Figure 7A:
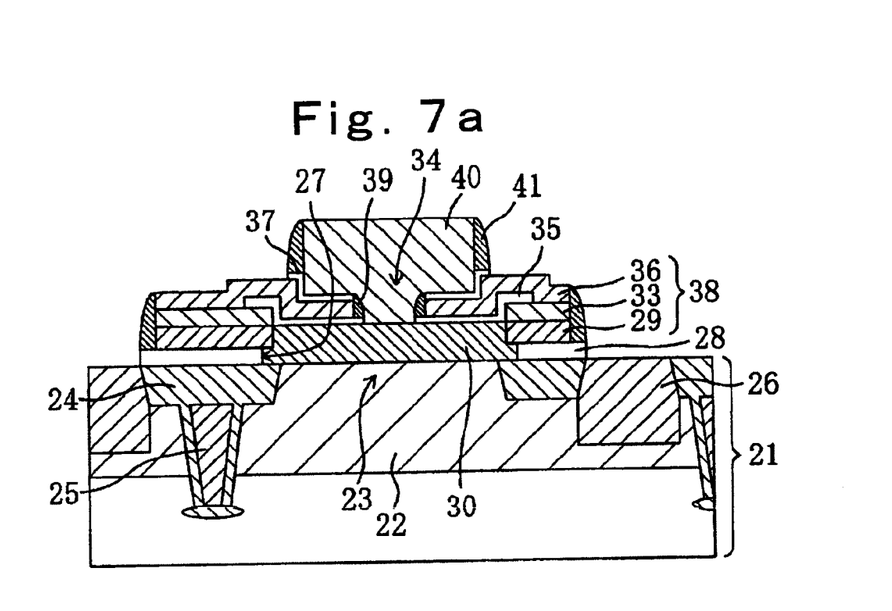
FIGS. 7a and 7b are sectional views showing steps of forming wiring and the like in the method of fabricating the bipolar transistor according to the second embodiment of the present invention.
Figure 7B:
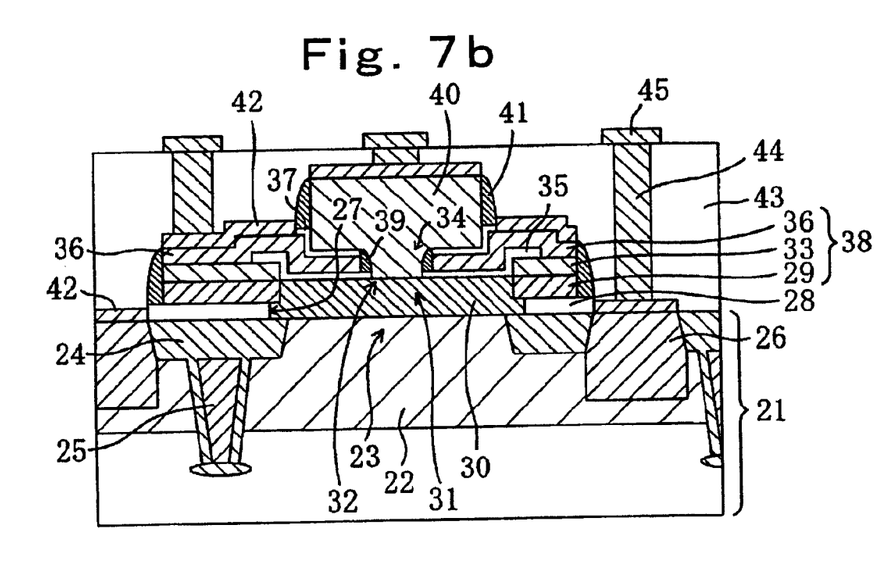

In a step shown in FIG. 7a, a deposited oxide film is formed on the substrate and etched, thereby forming sidewalls 41 on an outer side face of the n$^+$ polysilicon 40 and an outer side face of the extrinsic base 38. At this time, exposed portions of the first deposited oxide film 28 and the third deposited oxide film 37 are removed by over-etching, thereby exposing the surfaces of portions of the n$^+$ collector plug layer 26 and p$^+$ polysilicon layer 36.

Furthermore, in order to obtain the structure shown in FIG. 7b, the following treatments are performed. First, a Ti film is formed on the substrate, and thereafter a Ti silicide layer 42 is formed, by performing RTA treatment, on the exposed surfaces of the polysilicon layer 40, the p$^+$ polysilicon layer 36, and the n$^+$ collector plug layer 26. Then, an interlayer dielectric 43 is deposited on the substrate, and contact holes are formed to reach, through the interlayer dielectric 43, the Ti silicide layer 42 located on the n$^+$ collector plug layer 26, the p$^+$ polysilicon layer 36, and the polysilicon layer 40. W plugs 44 are formed by filling W films into the contact holes, and further metallic wiring 45 is formed.

Through the above-mentioned steps, the bipolar transistor according to the present embodiment is formed.

According to the present embodiment, the polysilicon layer 29 having a thickness of 50 nm to 300 nm is deposited on the shallow trench isolation 24 that surrounds the collector layer 23 of the Si substrate 21, with the first deposited oxide film interposed therebetween. Thereafter, the SiGe epitaxial layer 30 is formed, using the non-selective growth method, on the collector layer 23 where Si crystal is exposed, and the poly-SiGe layer 33 is formed on the polysilicon layer 29. Thereby, the layer thickness of the SiGe epitaxial layer 30 is easily controlled as described in the first embodiment. Especially when the SiGe epitaxial layer 30 has a Ge concentration profile in the thickness direction, the profile can be easily controlled. When the thickness of the polysilicon layer 29 is approximately 50 nm or more, the thickness of the SiGe epitaxial layer 30 formed in a region adjacent to the polysilicon layer is substantially constant. Therefore, the SiGe epitaxial layer 30 having a desired thickness can be obtained even if the thickness of the polysilicon layer 29 changes slightly.

In the present embodiment, since the polysilicon layer 29 partially constitutes the extrinsic base 38, the film thickness of the extrinsic base 38 is increased, thereby reducing a base resistance.

While, in the present embodiment, the first deposited oxide film 28 and the polysilicon film 29 are deposited on the substrate, and thereafter the upper portion of the collector layer 23 is removed by etching, any well-known method may be used to form the base opening portion 27 in the first deposited oxide film 28 and polysilicon film 29.

Although, in the CVD method used in the above-described fabrication, an example of the epitaxial growth using the ultra-high vacuum vapor growth method is illustrated, any other epitaxial growth method, such as a reduced pressure vapor growth method, may be used in the present embodiment.

In place of the SiGe epitaxial growth layer 30 of the present embodiment, any layer containing any other semiconductor material, such as Si-homo epitaxial growth layer or SiGeC growth layer, may be formed. Similarly, in place of the poly-SiGe layer 33, a poly-Si layer or a poly-SiGeC layer may be formed.

The SiGe epitaxial growth layer 30 of the present embodiment may be doped with an impurity by either the above-described in-situ doping or an ion implantation method.

(Third Embodiment)

Figure 8:
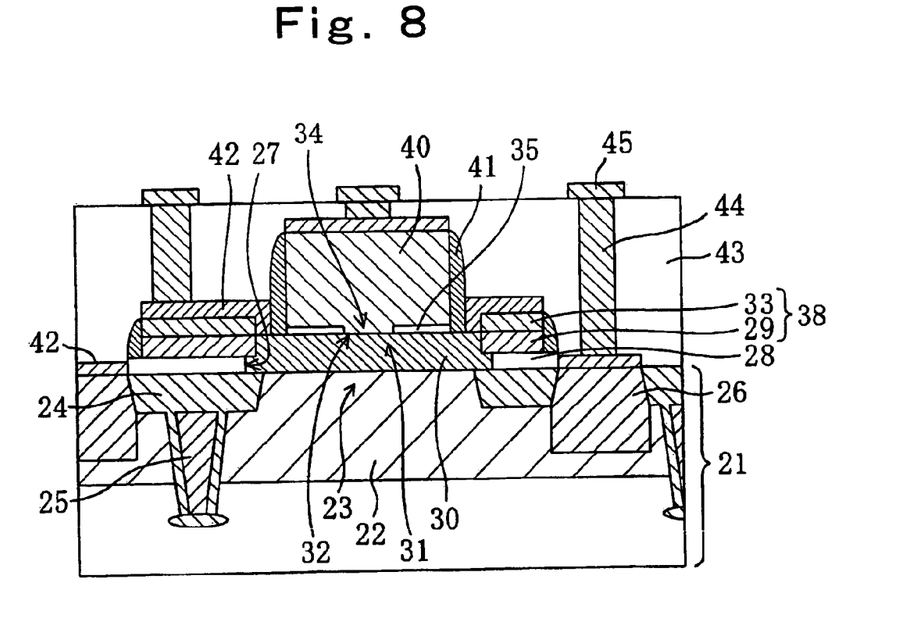
FIG. 8 is a sectional view showing a structure of a bipolar transistor according to a third embodiment of the present invention.

FIG. 8 is a sectional view showing a structure of a bipolar transistor according to a third embodiment of the present invention. In FIG. 8, the same reference numerals as those in FIG. 7b denote the same or corresponding parts. It should be noted that a collector layer 23 is more exaggerated than a shallow trench isolation 24 in FIG. 8.

As shown in FIG. 8, in the third embodiment, the extrinsic base 38 is comprised of the polysilicon layer 29, the poly-SiGe layer 33, and the p$^+$ polysilicon layer 36, whereas, in the present embodiment, the extrinsic base 38 is comprised of the polysilicon layer 29 and the poly-SiGe layer 33. According to the present embodiment, a second deposited oxide film 35 is formed in the step shown in FIG. 4b of the second embodiment. Then, the deposited oxide film 35 is patterned to have a predetermined shape, and an emitter opening portion 34 is formed in the deposited oxide film 35. Subsequently, an n⁺ polysilicon layer 40 is formed so as to fill the emitter opening portion 34. The subsequent steps are identical to those in the second embodiment. Since the p⁺ polysilicon layer 36, the third deposited film 37, and the sidewall 39 in the second embodiment need not be formed, the process can be simplified. Furthermore, since the polysilicon layer 29 formed for the thickness control of the SiGe epitaxial layer 30 can be used as part of the extrinsic base 38, an increase in volume of the bipolar transistor due to the provision of the polysilicon layer 29 can be suppressed.

(Other Embodiments)

Although, in the second embodiment, the p⁺ polysilicon layer 36 is formed without removing the poly-SiGe layer 33 after the poly-SiGe layer 33 is deposited, the p⁺ polysilicon layer 36 may be formed after the poly-SiGe layer 33 is formed and the poly-SiGe layer 33 is at least partially removed. In this case, the extrinsic base 38 is comprised of the polysilicon layer 29, the remaining portion of the poly-SiGe layer 33, and the p⁺ polysilicon layer 36.

The semiconductor device including an epitaxial growth layer and a polysilicon layer located around and having a thickness of not less than approximately 50 nm and a method of fabricating the semiconductor device, which are described in the first embodiment, can be applied to a MOS transistor, a photodetector, and their fabrication methods.

Numerous modifications and alternative embodiments of the present invention will be apparent to those skilled in the art in view of the forgoing description. Accordingly, the description is to be construed as illustrative only, and is provided for the purpose of teaching those skilled in the art the best mode of carrying out the invention. The details of the structure and/or function may be varied substantially without departing from the spirit of the invention.

What is claimed is:

1. A method of fabricating a semiconductor device comprising:
    a step A of forming a polycrystalline or amorphous preliminary semiconductor layer on a surface of a substrate so as to have an opening portion; and
    a step B of simultaneously forming an epitaxial growth layer on an exposed portion of a surface of the substrate through the opening portion and a non-epitaxial growth layer on the preliminary semiconductor layer using a CVD growth method while heating the substrate inside a reaction chamber by means of a heat source inside the reaction chamber, the epitaxial growth layer being made of single crystalline semiconductor, and the non-epitaxial growth layer being comprised of a polycrystalline or amorphous semiconductor layer,
    wherein the preliminary semiconductor layer has a layer thickness of not less than 50 nm and not more than 150 nm.

2. The method according to claim 1, wherein an opening ratio defined as a ratio of an area of the opening portion to a surface area of the substrate is not less than 0.1% and not more than 20%.

3. The method according to claim 1, wherein the preliminary semiconductor layer is mainly made of at least one of Si polycrystal, SiGe polycrystal, and SiGeC polycrystal.

4. The method according to claim 1, wherein the epitaxial growth layer is mainly made of at least one of Si single crystal, SiGe single crystal, and SiGeC single crystal.

5. The method according to claim 1, wherein
    the semiconductor device is a bipolar transistor,
    the substrate has an active region which is made of single crystal semiconductor and an isolation region, each;
    the preliminary semiconductor layer is formed so as to have a base opening portion on at least a portion of a surface of the active region in the step A; and
    in the step B, using the CVD method, the epitaxial growth layer forming at least a portion of an intrinsic base is formed in the exposed portion of the surface of the active region through the base opening portion at the same time that the non-epitaxial growth layer forming at least another portion of the extrinsic base is formed on the preliminary semiconductor layer, while the substrate is heated within the reaction chamber by means of the heat source within the reaction chamber.

6. The method according to claim 1, wherein the preliminary semiconductor layer forms at least a portion of the extrinsic base.

7. The method according to claim 1, wherein the heat source is a heater disposed within the reaction chamber.

8. The method according to claim 1, wherein the heat source generates heat with energy supplied in the form other than heat from an outside of the reaction chamber.

* * * * *